United States Patent [19]
Fukuyama et al.

[11] Patent Number: 5,556,714
[45] Date of Patent: Sep. 17, 1996

[54] METHOD OF TREATING SAMPLES

[75] Inventors: Ryooji Fukuyama; Makoto Nawata, both of Kudamatsu; Yutaka Kakehi, Hikari; Hironobu Kawahara; Yoshiaki Sato, both of Kudamatsu; Yoshimi Torii, Tachikawa; Akira Kawaraya; Yoshie Sato, both of Kudamatsu, all of Japan

[73] Assignee: Hitachi, Ltd., Tokyo, Japan

[21] Appl. No.: 315,260

[22] Filed: Sep. 29, 1994

Related U.S. Application Data

[62] Division of Ser. No. 966,849, Oct. 27, 1992, Pat. No. 5,380,397, which is a continuation of Ser. No. 569,021, Aug. 17, 1990, abandoned.

[30] Foreign Application Priority Data

| Aug. 28, 1989 | [JP] | Japan | 1-218523 |
| Nov. 2, 1989 | [JP] | Japan | 1-284711 |
| May 9, 1990 | [JP] | Japan | 2-117596 |

[51] Int. Cl.⁶ ................................................ B32B 15/20
[52] U.S. Cl. .......................... 428/620; 428/650; 428/457
[58] Field of Search .................................. 428/626, 650, 428/651, 620, 457; 156/646, 643, 656, 665, 651, 668; 134/1, 2, 31

[56] References Cited

U.S. PATENT DOCUMENTS

| 4,325,984 | 4/1982 | Galfo et al. ................................ 427/38 |
| 5,380,397 | 1/1995 | Fukuyama et al. ..................... 156/643 |

FOREIGN PATENT DOCUMENTS

| 0078224 | 5/1983 | European Pat. Off. |
| 0140201 | 5/1985 | European Pat. Off. |
| 0247603 | 12/1987 | European Pat. Off. |
| 55-91842 | 7/1980 | Japan |

OTHER PUBLICATIONS

H. R. Potts, IBM Technical Disclosure Bulletin, "Plasma Corrosion Corrossion Inhibition", vol. 24, No. 113, Apr. 1982, p. 6001.

Tsukada et al., "After Corrosion Treatment in Aluminum Alloy Reactive Ion Etching", ElectroChem. Soc., 1983, pp. 341–352.

Primary Examiner—John Zimmerman
Attorney, Agent, or Firm—Antonelli, Terry, Stout & Kraus

[57] ABSTRACT

A post-etch treatment method capable of imparting high corrosion prevention performance to the aluminum-containing wiring films. The sample of aluminum-containing wiring material that is etched using the halogen-type gas is treated with the plasma of a gas that has the oxygen component, and the resist formed on the aluminum-containing wiring material is reacted with oxygen and is removed. Further, the plasma is generated using a gas having the hydrogen component or this gas is liquefied into droplets thereof on the sample surface, so that halogen components (Cl, Br, etc.) adhered to the aluminum-containing wiring material through the etching treatment are reacted with hydrogen and are effectively removed in the form of hydrogen chloride (HCl) or hydrogen bromide (HBr). This makes it possible to obtain the aluminum-containing wiring material having high corrosion prevention performance.

12 Claims, 4 Drawing Sheets

METHOD OF TREATING SAMPLES

This is a divisional of application Ser. No. 07/966,849, filed Oct. 27, 1992, now U.S. Pat. No. 5,580,397, which is a continuation of application Ser. No. 07/569,021, filed Aug. 17, 1990, now abandoned.

BACKGROUND OF THE INVENTION

1. Field of the Invention

The present invention relates to a method of treating samples, and particularly to a method of treating samples adapted to corrosion prevention treatment of aluminum-containing wiring materials after they have been subjected to the etching treatment.

2. Description of the Prior Art

According to a conventional method of treating aluminum-containing wiring materials as disclosed in, for example, Japanese Patent Publication No. 41766/1983, a semiconductor wafer on which an aluminum-copper alloy film is formed is set in a reactive sputter-etching apparatus, the aluminum-copper alloy film is patterned using a plasma of such a gas as $BCl_3$, $CCl_4$, $PCl_3$, $BBr_3$ or the like, a hydrogen plasma is generated in the same apparatus, and the patterned aluminum-copper alloy film is exposed to the hydrogen plasma so as to be anti-corrosion treated.

In the above conventional technology, however, no attention has been given to removing residual or adhered matter after the etching treatment. In carrying out the etching treatment, in general, the aluminum-containing wiring material (hereinafter referred to as "wiring film") is masked with a photoresist or the like. The wiring film, in this case, may be aluminum-containing films (Al, Al—Si, Al—Cu, Al—Si—Cu, etc.) and laminated wiring films such as aluminum-containing film+barrier metal, cap metal, reflection-preventing film+aluminum-containing film+barrier metal. (The barrier metal is composed of TiW, TiN or the like, and is provided between the silicon substrate and the aluminum-containing film, in order to prevent defective junction due to mutual diffusion of the silicon substrate and the aluminum-containing film and to prevent the wiring resistance from increasing due to the precipitation of silicon in the aluminum-containing film. The cap metal is composed of TiW, TiN, MoSi, or the like, and is used as the uppermost layer of the wiring film of a laminated structure, or is used as the reflection-preventing film. The reflection-preventing film is formed on the aluminum film to suppress the reflection of light at the time of exposure, so that there is formed a resist pattern faithful to the mask.) The etching treatment is effected to treat the wafer on which the wiring film is formed using the plasma of a single gas of the type of halogen such as $BCl_3$, $Cl_2$, $CCl_4$, $SiCl_4$, HBr, $BBr_3$ or the like, or a mixture gas thereof. The etching treatment is usually the one that is called reactive ion etching. With the reactive ion etching, the wiring film is etched maintaining a pattern faithful to the mask due to the interaction of radicals and ions in the plasma of the halogen-type gas, and the wiring pattern is obtained.

On the thus etched wiring pattern remains a photoresist (hereinafter referred to as "resist") which is a masking material. Halogen components in the plasma adhere on the surface of the resist during the etching and halogen components are implanted due to the bombardment of ions. On the side wall of the etched wiring pattern are adhered the halogen components during the etching or the resist components sputtered by the bombardment of ions. Moreover, aluminum component of the once etched wiring film adhere on the side walls again thereby to form a layer that is called side wall. This layer consists of such components as aluminum, chlorine, carbon, hydrogen, etc. that are adhered in a random fashion.

According to the above-mentioned conventional technology, a hydrogen plasma is generated in the apparatus after the etching treatment, and the patterned aluminum-copper film is exposed to the hydrogen plasma so that the aluminum-copper alloy film is anticorrosion-treated. In the treatment with hydrogen plasma, the halogen components adhered to the surfaces between the resist and the wiring pattern or adhered to the portions very close to these surfaces, undergo the reaction with hydrogen in the hydrogen plasma and can be removed as hydrogen chloride (HCl) or hydrogen bromide (HBr). However, the halogen components remaining in the resist and in the side walls are not allowed to come in contact with the hydrogen plasma and cannot be removed. Therefore, corrosion easily takes place in the wiring film due to the local battery action between the wiring film materials (between different metals) of the laminated structure or due to halogen components in the side wall (hereinafter referred to as "residual adhered matter").

Japanese Patent Laid-Open No. 43132/1987 can be cited as a prior art related to the present invention. This prior art discloses a method of plasma treatment to remove organic film (resist) on the silicon substrate in the plasma of an oxygen gas obtained by adding a compound containing at least carbon or oxygen to the oxygen, e.g., by adding methanol ($CH_3OH$) to the oxygen. According to this prior art, the rate of removing resist is increased (relative to the treatment using the oxygen gas plasma) and damage is prevented owing to the treatment with the plasma of a gas obtained by adding methanol ($CH_3OH$) to the oxygen ($O_2$). However, this prior art is quite silent about the prevention of corrosion of the wiring film (aluminum-containing wiring material).

According to another prior art disclosed in Japanese Patent Publication No. 30268/1987, the aluminum film or the aluminum alloy film is etched using a halogen compound gas, and is then subjected to the anticorrosion treatment using the plasma of a mixture gas consisting of fluorocarbon ($CF_4$) and oxygen ($O_2$) without taking the aluminum film or the aluminum alloy film out of the container.

SUMMARY OF THE INVENTION

The object of the present invention is to provide a method of treating samples which is capable of imparting high corrosion preventing performance to the aluminum-containing wiring materials.

The present invention is concerned with a method of treating samples comprising a step for etching a sample of aluminum-containing wiring material using a halogen-type gas; a step for removing resist using a gas that contains oxygen component; and a step of anticorrosion treatment using a gas that contains hydrogen component. After the etching treatment, the aluminum-containing wiring material is treated with the plasma of a gas that has oxygen component, such that the resist provided on the aluminum-containing wiring material is reacted with oxygen and is removed. The aluminum-containing wiring material is further treated with the plasma of a gas that contains hydrogen component or is treated by liquefying such a gas into droplets thereof on the surface of the sample. Therefore, the halogen components (Cl, Br, etc.) adhered to the aluminum-containing wiring material during the etching treatment undergo the reaction with hydrogen and are effectively removed in the form of hydrogen chloride (HCl) or hydrogen bromide (BBr). Thus, high corrosion prevention performance is imparted to the aluminum-containing wiring material.

DESCRIPTION OF THE PREFERRED EMBODIMENT

EXAMPLES

An embodiment of the present invention will be described in conjunction with FIGS. 1 to 6.

Figure 1:
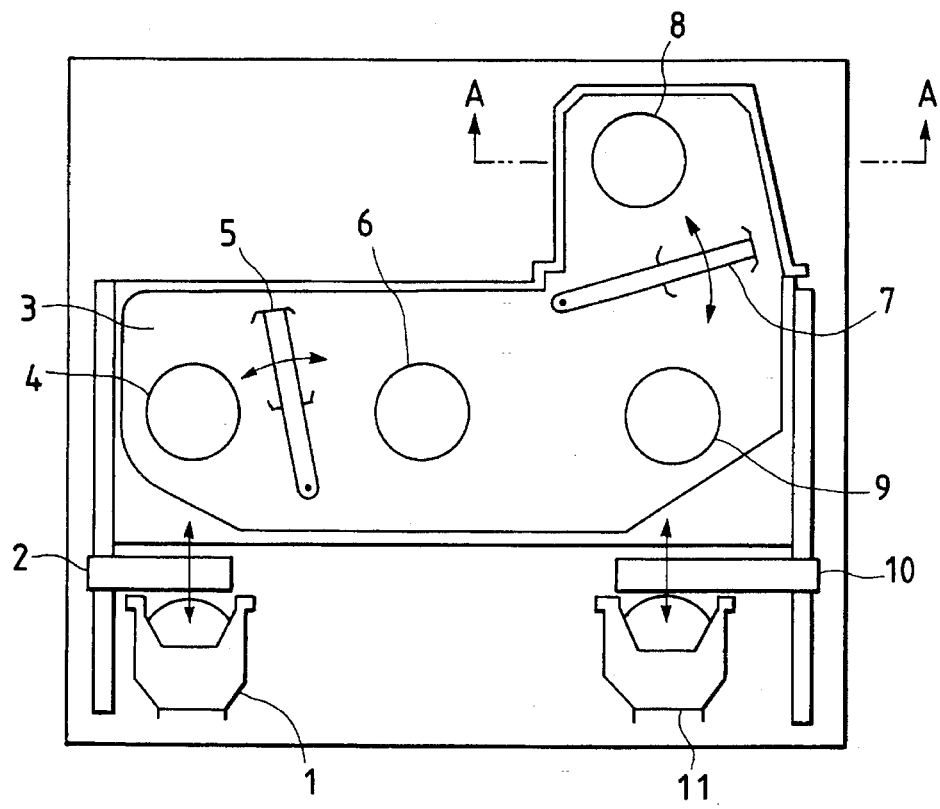
FIG. 1 is a plan view illustrating an embodiment of an apparatus with which the present invention is put into practice.

FIG. 1 shows a continuously treating apparatus which is capable of continuously carrying out the etching treatment and the post-etch treatment under vacuum condition. A buffer chamber 3 defines space from load lock chambers 4, 9 through an etching chamber 6 up to a post-etch treatment chamber 8. Here, each of the buffer chamber 3, load lock chambers 4, 9, etching chamber 6, and post-etch treatment chamber 8 can be independently partitioned by air-tight means and can be evacuated by an exhaust device (not shown). A load-side cassette 1 is disposed to be opposed to the load lock chamber 4, and a go-straight arm 2 is arranged therebetween. An unload-side cassette 11 is disposed to be opposed to the load lock chamber 9, and a go-straight arm 10 is arranged therebetween.

In this apparatus, the process flows as described below. First, a sample (wafer in this case) that is to be treated is introduced into the load lock chamber 4 which is open to the atmosphere from the load-side cassette 1 by the go-straight arm 2. Thereafter, the load lock chamber 4 is air-tightly closed and is evacuated by the vacuum device from the condition of atmospheric pressure to a vacuum condition. Then, the load lock chamber 4, the buffer chamber 3, and the etching chamber 6 are communicated with each other, and the sample is carried by a swing arm 5 into the etching chamber 6 evacuated into a vacuum condition via the buffer chamber 3 that is also evacuated into a vacuum condition. Thereafter, the etching chamber 6 is air-tightly closed to carry out a predetermined etching treatment therein. After the etching treatment is finished, the etching chamber 6, buffer chamber 3 and post-etch treatment chamber 8 are communicated with each other, and the sample is carried by a swing arm 7 into the post-etch treatment chamber 8 that is evacuated into a vacuum condition via the buffer chamber 3 that is evacuated into a vacuum condition. Thereafter, the post-etch treatment chamber 8 is air-tightly sealed to carry out a predetermined post-etch treatment therein. After the post-etch treatment is finished, the post-etch treatment chamber 8, the buffer chamber 3 and the load lock chamber 9 are communicated with each other, and the sample is carried by the swing arm 7 into the load lock chamber 9 that is evacuated into a vacuum condition via the buffer chamber 3 that has been evacuated to the vacuum condition. Then, the load lock chamber 9 is air-tightly closed, and a leakage gas such as $N_2$ gas is introduced into the load lock chamber 9 to elevate the pressure up to the atmospheric pressure. Then, the load lock chamber 9 is opened, and the treated sample is delivered from the load lock chamber 9 by the go-straight arm 10 and is stored in the unload-side cassette 11 to complete a series of treatments.

Figure 2:
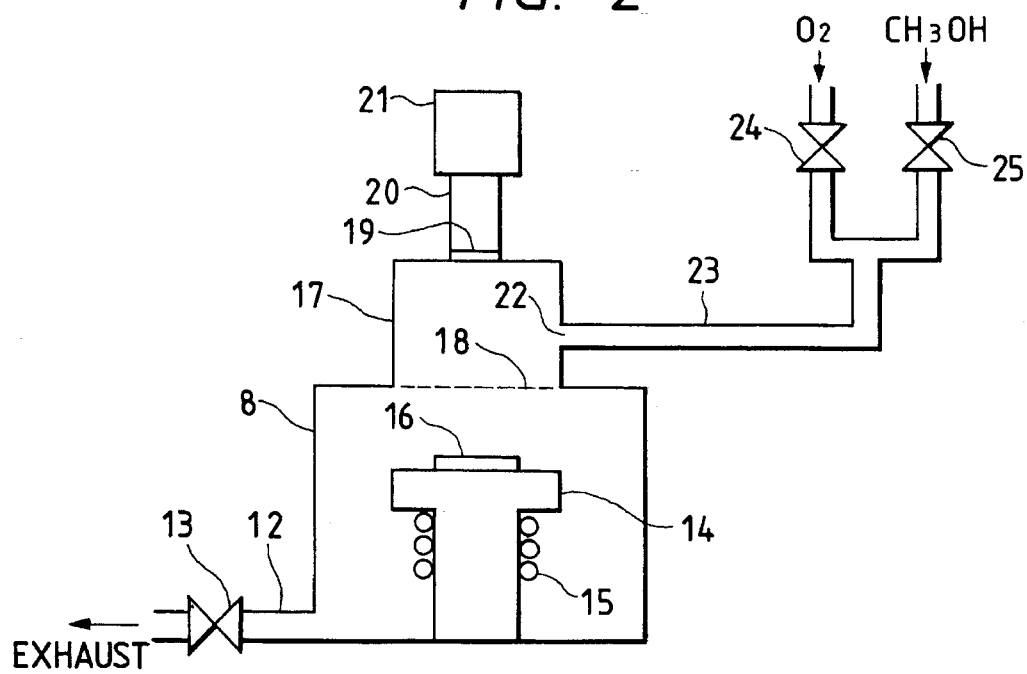
FIG. 2 is a vertical section view of a sample treatment apparatus as viewed from the line A—A in FIG. 1.

FIG. 2 is a vertical section view of the sample treatment apparatus illustrating the portion of the post-etch treatment chamber 8 of FIG. 1. Over the post-etch treatment chamber 8 is provided a plasma generating chamber 17 that is partitioned by an aluminum porous plate 18. The upper opening of the plasma generating chamber 17 is closed by a window 19 of quartz, and a microwave waveguide 20 having a microwave oscillator 21 at the end is mounted on the opening. The plasma generating chamber 17 is provided with a gas feed port 22 to which is connected a gas feed pipe 23 to feed a treatment gas into the plasma generating chamber 17 from a gas feed source (not shown) via flow rate control valves 24 and 25. The post-etch treatment chamber 8 is provided with an exhaust port 12 to which is connected a vacuum device (not shown) via a pressure control valve 13 to evacuate the interior of the post-etch treatment chamber 8. The post-etch treatment chamber 8 is further provided with a sample plate 14 on which a sample 16 is placed being opposed to the plasma generating chamber 17. The sample plate 14 is equipped with a heating device 15 for heating the sample 16.

In the thus constituted sample treatment apparatus, the microwaves of a frequency of, in this case, 2.45 GHz generated by the microwave oscillator 21 are guided into the plasma generating chamber 17 propagating through the microwave waveguide 20 and the window 19. The microwaves introduced into the plasma generating chamber 17 excite the treatment gas that is introduced into the plasma generating chamber 17. Then, a plasma is generated in the plasma generating chamber 17. The aluminum porous plate 18 provided between the plasma generating chamber 17 and the post-etch treatment chamber 8 reflects the microwaves so as not to enter into the post-etch treatment chamber 8, and prevents the generation of plasma in the post-etch treatment chamber 8. The plasma and chiefly radical components in the plasma generating chamber 17 that has passed through the porous plate 18 is guided onto the sample 16 carried by the exhaust stream of the post-etch treatment chamber 8.

Figure 3:
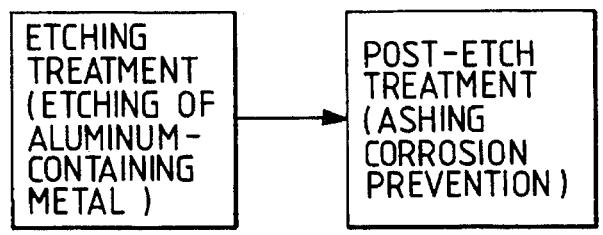
FIGS. 3, 5 and 6 are diagrams illustrating the procedure of treatment using the apparatus of FIG. 1.

Using the continuous treatment apparatus shown in FIGS. 1 and 2, the treatment is carried out according to the procedure shown in FIG. 3.

In the etching chamber 6, first, the sample 16 on which the wiring film (aluminum-containing wiring material) is formed is etched using a halogen-type gas. The etching treatment is carried out by using an RIE apparatus or a microwave apparatus. Described below is a case of the etching treatment carried out using, for example, a microwave etching apparatus in the presence of magnetic field wherein the sample to be treated is placed on the sample plate, a plasma of the treatment gas is formed by the action of electric field of the microwaves and magnetic field of the solenoid coil, and the sample is etched by the application of a high-frequency bias. In this case, the sample 16 on which the wiring film is formed is obtained by forming a heat oxidized film ($SiO_2$) maintaining a thickness of 600 nm on the silicon substrate, and then forming a TiN film, an Al—Si (1%)—Cu (0.5%) film, and TiN film thereon maintaining thicknesses of 100 nm, 700 nm and 50 nm, respectively, and then forming a resist film thereon maintaining a thickness of 1800 nm. Further, the wiring pattern is formed in the resist film which is used as a mask for etching. Further, a mixture gas consisting of $BCl_3$ (60 cc/min.) and $Cl_2$ (90 cc/min.) is used as the halogen-type gas. The etching treatment is carried out under the conditions of a pressure of 2.1 Pa, microwave current of 300 mA, and high-frequency electric power of 90 watts.

After the etching treatment of the sample 16, there remain components that cause the sample 16 to corrode due to the reasons mentioned in the foregoing prior art. That is, the resist which is a masking material remains on the wiring pattern that is formed by etching, and halogen which, in this case, is chlorine component remains in the resist and on the surface of the resist. Further, the residual adhered matter consisting of aluminum, chlorine, carbon, hydrogen, etc. remains on the side walls of the wiring pattern.

Next, the sample 16 on which the resist and residual adhered matter remain is sent to the post-etch treatment chamber 8 to effect the post-etch treatment which is carried out as described below. That is, the flow rates of an oxygen gas ($O_2$) and a methanol gas ($CH_3OH$) containing hydrogen component are adjusted by the flow rate control valves 24 and 25, and these gases are mixed together and are introduced into the plasma generating chamber 17. In this case, for instance, the flow rate of oxygen gas is 400 cc/min., the flow rate of methanol gas is 80 cc/min., and the pressure in the post-etch treatment chamber 8 is 160 Pa. Next, the microwaves are introduced into the plasma generating chamber 17 from the microwave oscillator 21. For instance, the microwave output in this case is 400 mA. Then, a plasma of hydrogen component (H), oxygen component (O) and other components is generated in the plasma generating chamber 17. In this case, the plasma consisting chiefly of radicals is guided into the post-etch treatment chamber 8 accompanying the evacuating exhaust stream. Radicals are chiefly comprised of hydrogen and oxygen. The hydrogen radicals react with the chlorine component (Cl) in the residual adhered matter (Al, Cl, C, H, etc.) to form hydrogen chloride (HCl) which volatilizes or forms $H_2O$ to dissolve the elute chlorine component contributing presumably to removing residual chlorine component that is a cause of corrosion to the wiring film. Further, the oxygen radicals react with the resist to form CO and $CO_2$ that volatilize, so that the organic components composed chiefly of resist are removed.

Thus, the wiring film after the etching treatment is treated using the plasma of the treatment gas consisting of a mixture of methanol gas and oxygen gas, and whereby the resist and the residual adhered matter remaining on the sample are removed and, further, the chlorine components remaining on the surface and inside the sample which cause corrosion are removed. This makes it possible to obtain corrosion prevention performance of longer than 24 hours even in a clean room environment. Since the treatment is carried out while removing the resist, the ashing treatment can be effected at the same time. At this moment, the sample plate 14 is heated by the heating device 15 to heat the sample that is being treated with plasma. Therefore, the chemical reaction of the residual adhered matter or the resist with the radicals is assisted to more efficiently remove the residual matter (residual adhered matter and resist) after the etching treatment.

Figure 4:
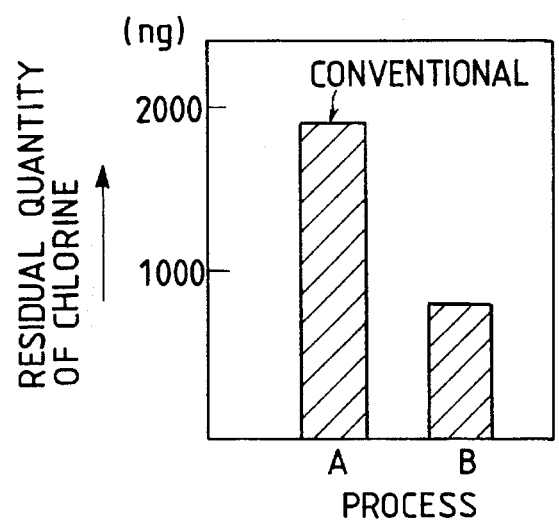
FIG. 4 is a diagram showing residual quantity of chlorine which shows the effect of corrosion prevention treatment according to the present invention.

As concrete examples of treatment, described below in conjunction with FIG. 4 are the conventional post-etch treatment and the post-etch treatment of this embodiment in comparison with each other using an aluminum film as the wiring film.

FIG. 4 is a diagram showing the residual chlorine quantity reducing effect according to this embodiment. The treatment A of FIG. 3 shows the residual chlorine quantity of the case when the treatment is effected for two minutes in a customary manner using the plasma of a mixture gas consisting of oxygen ($O_2$) and carbon tetrafluoride ($CF_4$). The treatment B shows the residual chlorine quantity of the case when the treatment is effected for one minute using a mixture gas consisting of methanol ($CH_3OH$) and oxygen ($O_2$). In the treatment B, the additional treatment is effected for one minute using the plasma of oxygen to prevent the resist from remaining after the treatment using the mixture gas. The sample is an aluminum-film wafer with a 6-inch wiring pattern, the aluminum film having a thickness of 800 nm.

The treatment A is carried out under the conditions of an oxygen flow rate of 400 cc/min, a carbon tetrafluoride flow rate of 20 cc/min and a treatment pressure of 160 Pa. The treatment B is first carried out under the conditions of a methanol flow rate of 80 cc/min, an oxygen flow rate of 400 cc/min and a treatment pressure of 160 Pa., and is then carried out under the conditions of an oxygen flow rate of 400 cc/min and a treatment pressure of 160 Pa. The treatment B is carried out while setting the sample plate temperature at 250° C. such that the resist ashing rate becomes nearly equal to the values of when a mixture gas of oxygen and carbon tetrafluoride is used. The sample plate 14 should be set at a temperature of 200° C. to 350° C. from the relationship of the ashing rate of the resist and the thermal damage to the aluminum film.

As shown in FIG. 4, the treatment with the plasma of a gas containing hydrogen and oxygen according to this embodiment makes it possible to decrease the residual chlorine content to less than about one-half compared with that of the prior art. Therefore, the corrosion prevention performance of longer than 24 hours to obtained even under clean room environment.

As described above, it is better to reliably remove the resist by effecting the additional treatment with the plasma of an oxygen gas after the treatment with the plasma of a gas containing hydrogen component and oxygen component such as methanol or with the plasma of a mixture gas of methanol or the like and oxygen. When the residual adhered matter and resist can be removed by the treatment with the plasma of a mixture gas of methanol or the like and oxygen, however, the additional treatment with the plasma of oxygen shown in FIG. 3 needs not be carried out.

Though the chlorine-containing gas was used as the halogen-type gas for the etching treatment of the wiring film, the same effects are also obtained even when the bromine-type gas is used.

Figure 5:
Figure 6:
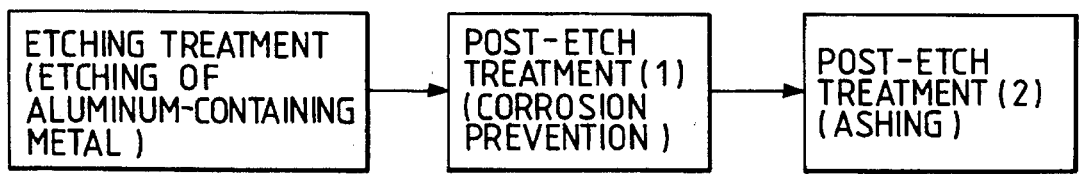

In the aforementioned treatment procedure, the methanol gas and the oxygen gas are mixed together to produce a plasma, in order to carry out the corrosion prevention treatment and the ashing treatment simultaneously. As shown in FIGS. 5 and 6, however, it is also allowable to divide the step into those of the gas plasmas by changing the treatment gas, i.e., to divide the step into one of the corrosion prevention treatment and the one of the ashing treatment which are carried out after the etching treatment.

According to the procedure of treatment shown in FIG. 5, the resist component (C, H, etc.) is removed (ashing treatment) with the plasma of oxygen gas ($O_2$) after the etching treatment. Then, the treatment gas is changed, and the residual matter (resist component, etc.) and the chlorine component are removed (corrosion prevention treatment) with the plasma of, in this case, the treatment gas of a mixture of oxygen gas ($O_2$) and methanol gas ($CH_3OH$). The treatment gas used for the corrosion prevention treatment may be a treatment gas consisting of a mixture of an inert gas such as helium or argon, a gas having $N_2O$ or $O_3$ and H components (such as methanol ($CH_3OH$), ethanol ($C_2H_5OH$), acetone ($CH_3COCH_3$), hydrogen ($H_2$), ethane ($CH_4$) or the like), or a gas containing hydrogen component only, in addition to the treatment gas consisting of a mixture of oxygen gas ($O_2$) and methanol gas ($CH_3OH$). By using a gas having oxygen component, the effect fo— removing the rasidual matter can be expected.

According to the procedure of treatment shown in FIG. 6, the residual adhered matter and chlorine component adhered to the resist are removed with the plasma of a treatment gas of a mixture of an inert gas without containing oxygen component and a gas containing hydrogen component after the etching treatment and, then, the treatment gas is changed in order to remove the resist with the plasma of the oxygen gas ($O_2$). Even in this case, the above-mentioned gases can be used as the treatment gases. Or, the treatment may be carried out while switching these gases.

According to this embodiment, as described above, the chlorine quantity remaining in the wiring film after the etching treatment can be greatly reduced compared with that of the prior art, and high corrosion prevention performance is imparted to the wiring film after the etching treatment.

The apparatus in the post-etch treatment portion in this embodiment is constituted by providing the porous plate 18 between the plasma generating chamber 17 and the post-etch treatment chamber 8 as shown in FIG. 2. It is, however, also allowable to directly treat the sample 16 with the plasma generated in the plasma generating chamber 17 without employing the porous plate. Further, the plasma is generated using microwaves. It is, however, also allowable to employ an RIE apparatus of the type of parallel flat plates using high-frequency electric power or any other system using high-frequency electric power such as a cylindrical-type apparatus, provided it is capable of generating plasma that contains hydrogen component and oxygen component.

In this embodiment, furthermore, the etching treatment and the post-etch treatment are incorporated in the same apparatus as shown in FIG. 1 and are continuously carried out. The invention, however, is in no way limited thereto only. That is, when the resist and the residual adhered matter are to be removed simultaneously, the subsequent additional treatment with the plasma of oxygen may be carried out in a separate treatment chamber which is provided on the outside of the apparatus that is shown in FIG. 1.

Furthermore, the resist may be removed by the widely known ashing treatment using the plasma of a mixture gas consisting of oxygen gas and a fluorine-type gas. The ashing treatment with the plasma of a mixture gas of oxygen gas and fluorine-type gas is effective for the corrosion prevention treatment particularly when a silicon-type material is contained in the resist material for forming pattern. When the silicon-type material (silicon-type inorganic resist or silicon photoresist) is used as the resist material, the ashing treatment with the oxygen radicals permit the silicon in the resist material to react with oxygen radicals to form silicon oxide that stays thereon, making it difficult to sufficiently carry out the ashing treatment for the resist. The remaining resist causes the wiring to corrode due to the residual chlorine or stays as foreign matter when an insulating film is to be formed on the wiring film causing poor insulation of the circuit, and deteriorates the yields of production. Therefore, the resist should be removed as much as possible.

The ashing treatment with the plasma of mixture gas of oxygen gas and fluorine-type gas is carried out after the plasma treatment (corrosion prevention treatment) that uses methanol or the mixture gas of methanol and oxygen, and that is effected after the etching treatment. Therefore, when the silicon-type material is used as the resist material component, the residual adhered matter and the resist that stay on the wiring film after the etching treatment can be effectively removed to accomplish high corrosion prevention performance. In the ashing treatment using the plasma of a mixture gas of oxygen and fluorine-type gas, furthermore, the sample plate should be maintained at a temperature of lower than 50° C. when the sample 17 is composed of a barrier metal in order to prevent side etching of TiN film or TiW film that lies under the wiring film.

A second embodiment of the present invention will now be described in conjunction with FIG. 7.

Figure 7:
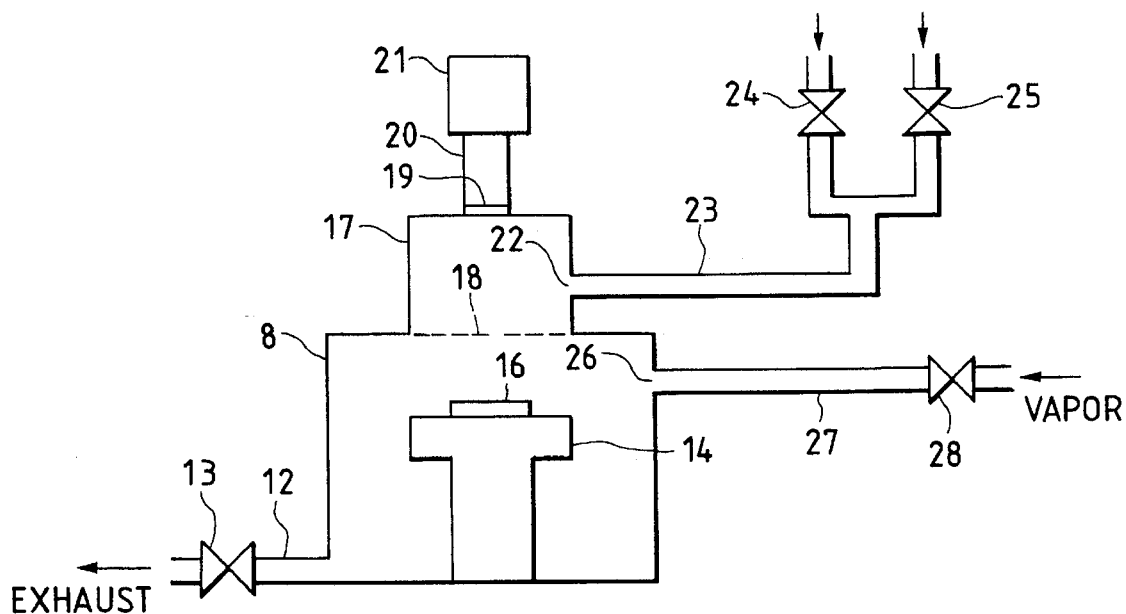
FIG. 7 is a vertical section view illustrating a sample treatment apparatus with which a second embodiment of the present invention is put into practice.

In FIG. 7, the same reference numerals as those of FIG. 2 denote the same members and their description is not repeated here. What makes FIG. 7 different from FIG. 2 is that the post-etch treatment chamber 8 is provided with a feed port 26 to which is connected a feed pipe 27 that is connected, via a flow rate control valve 28, to a gas feed source (not shown) for adsorption/desorption treatment, so that a gas for adsorption/desorption treatment can be supplied into the post-etch treatment chamber 8.

With the thus constituted apparatus, the sample 16 after the etching treatment with the plasma of a halogen-type gas is subjected to the treatment for removing resist in the post-etch treatment chamber 8 using the plasma of an oxygen gas which is one of the methods mentioned in the foregoing first embodiment. Thereafter, the residual components that cause corrosion are removed as described below.

Figure 8:
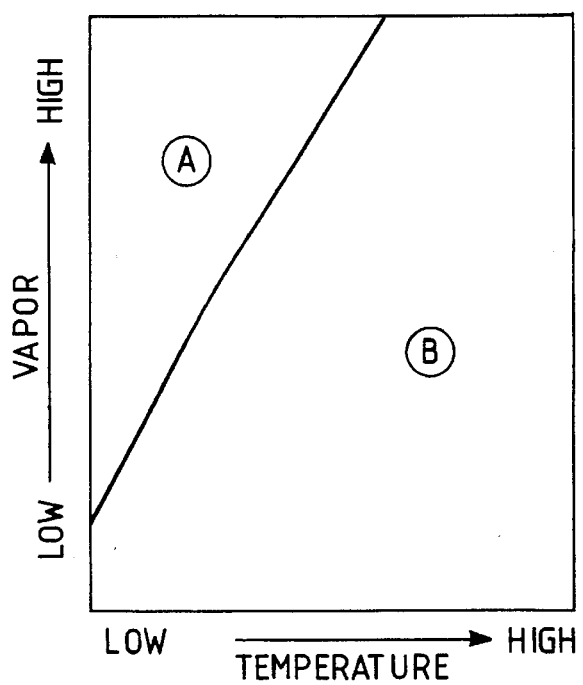
FIG. 8 is a diagram showing a curve of saturated vapor pressure.

First, the gas for adsorption/desorption treatment is supplied at a controlled flow rate into the post-etch treatment chamber 8 from the source (not shown) of feeding the gas for adsorption/desorption treatment via the flow rate control valve 28 and the feed pipe 27. The gas, in this case, is that of pure water component or, concretely, vaporized gas of pure water. At this moment, the pressure control valve 13 for controlling the pressure in the post-etch treatment chamber 8 is maintained closed. This causes the pressure in the post-etch treatment chamber 8 to rise. Next, when a preset pressure in the post-etch treatment chamber is exceeded, i.e., when a pressure region denoted by A in FIG. 8 (pressure higher than the one that condenses the introduced gas) is reached that is above a saturated vapor pressure curve, supply of the gas is discontinued, and the pressure control valve 13 is opened. For instance, the sample plate temperature in this case is about 20° C., and the operation is repeated twice in which the pressure in the post-etch treatment chamber 8 is raised from 67 Pa to 4000 Pa and is decreased again down to 67 Pa each time.

By repeating the above-mentioned operation, the component that causes corrosion or halogen component, in this case, is dissolved and diluted on the sample surface after the ashing treatment owing to the adsorption of the introduced vaporized gas of pure water and the dropping of liquid formed by the rise in gas pressure. Thereafter, the interior in the post-etch treatment chamber 8 is evacuated (the pressure in the post-etch treatment chamber 8 is decreased into a region denoted by B in FIG. 8) to promote the vaporization and desorption of pure water in which are dissolved halogen components adhered onto the sample surface. This makes it possible to greatly decrease the amount of halogen components adhered on the sample, and the corrosion protection performance of longer than 24 hours is obtained even under a clean room environment.

According to the second embodiment which greatly decreases the amount of halogen remaining after the etching treatment and ashing treatment of the wiring film, it is allowed to obtain improved corrosion prevention performance. Moreover, no water-washing apparatus is needed. In addition, resist removing means is incorporated. Therefore, the treatment is carried out consistently in series from the etching treatment through the resist removal treatment up to the corrosion prevention treatment, making it possible to shorten the time for carrying samples among the treatment apparatuses and to shorten the waiting time, contributing to improving production efficiency. Moreover, since no water-washing apparatus is needed, the apparatus can be realized in a compact size.

Figure 9:
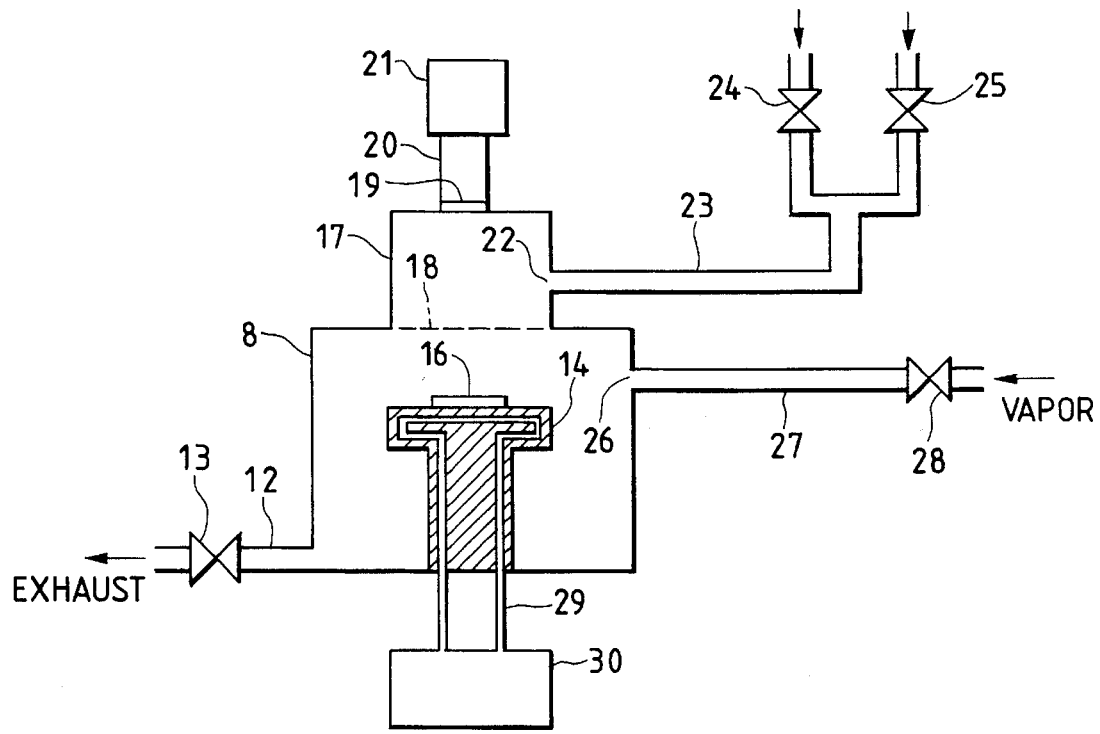
FIG. 9 is a vertical section view illustrating a sample treatment apparatus with which a third embodiment of the present invention is put into practice in relation to the second embodiment.

Next, a third embodiment will be described in conjunction with FIG. 9. The apparatus used in this embodiment consists of the apparatus shown in FIG. 2 but which is further equipped with temperature adjusting means (consisting of a constant temperature water vessel 30 and a cooling water flow path 29) for controlling the temperature of the sample plate 14.

According to this embodiment like the afore-mentioned second embodiment, the sample 16 is subjected to the etching treatment and the resist removal treatment, and the vaporized gas of pure water is introduced into the post-etch treatment chamber 8 in order to effect the adsorption and desorption of components that remain and cause corrosion to the sample 16. At this moment, the sample plate 14 on which the sample 16 is placed is maintained at a temperature of 0° C. to 20° C. which is lower than room temperature owing to the temperature adjusting means. In the adsorption/desorption treatment of the sample 16, therefore, the sample plate 14 and the sample 16 have a temperature lower than the periphery thereof, e.g., lower than the side walls of the post-etch treatment chamber 8 at the time of adsorption and desorption of the introduced gas, and the introduced gas is adsorbed in a concentrated manner. Therefore, the components, i.e., halogen components that are remaining on the sample 16 and that are causes of corrosion, are dissolved and diluted efficiently, enabling the halogen quantity remaining after the desorption to be greatly decreased.

This embodiment makes it possible to further enhance the corrosion prevention performance than the aforementioned embodiments.

According to this embodiment, the resist is removed after the etching treatment and, then, the adsorption and desorption are carried out to decrease the halogen component that remains on the sample to corrode it. However, it is also allowable to add the desorption promotion treatment (in this embodiment, the sample is heated while treating it with the plasma of oxygen after the adsorption and desorption) to carry out the treatment in series). This makes it possible to vaporize and remove the water content containing halogen component remaining after the adsorption and desorption and, hence, to obtain higher corrosion preventing performance than that of the second embodiment.

A fourth embodiment will now be described in conjunction with FIG. 10.

Figure 10:
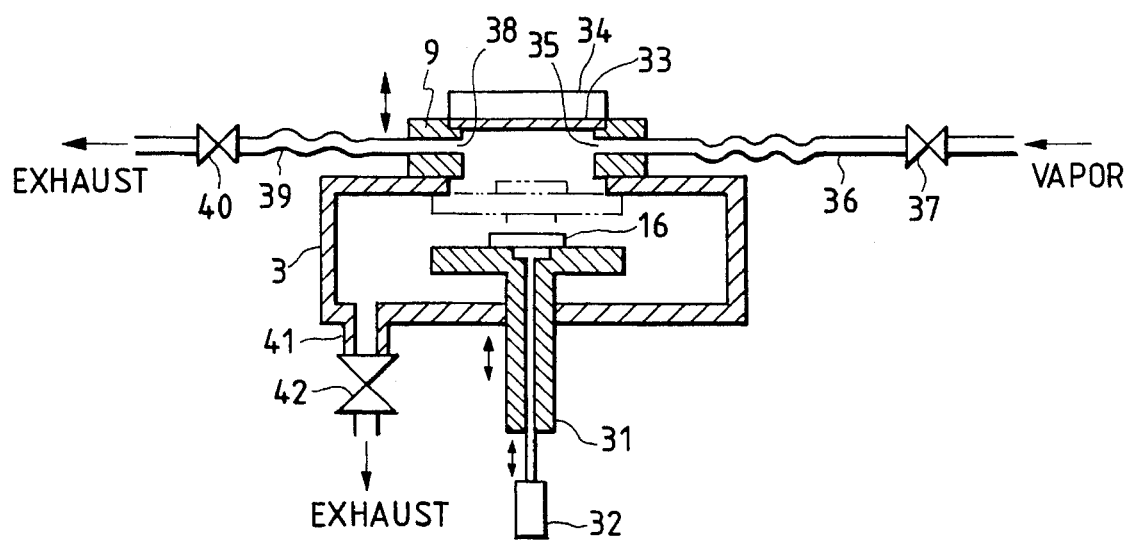
FIG. 10 is a vertical section view of a load lock chamber illustrating a fourth embodiment of the present invention in relation to the second embodiment.

In FIG. 10, the load lock chamber 9 shown in FIG. 1 is equipped with heating means to heat the sample 16 that is to be treated, and feeding means is provided to feed a gas for adsorption/desorption treatment into the load lock chamber 9. The heating means consists of a heating device 34 placed on a quartz glass 33 that hermetically closes the upper opening of the load lock chamber 9. The heating device 34 in this case is a lamp heater. The feeding means for feeding a gas for adsorption/desorption treatment consists as in the second embodiment of providing the load lock chamber 9 with a feed port 35 to which is connected, via a flow rate control valve 37, a feed pipe 36 that is connected to the source (not shown) that feeds the gas for adsorption/desorption treatment. Reference numeral 38 denotes an exhaust port formed in the load lock chamber 9. An exhaust device (not shown) is connected to the exhaust port 38 via an exhaust pipe 39 and a pressure control valve 40. Reference numeral 41 denotes an exhaust port formed in the buffer chamber 3. An exhaust device (not shown) is connected to the exhaust port 41 via a pressure control valve 42. The sample plate 31 moves up and down, and comes in contact with the upper opening in the buffer chamber 3 to form the load lock chamber 9. The device for pushing up the sample 16 works to easily hand the sample 16 over to the carrier device such as the swing arm at the time of delivering the sample into or out of the buffer chamber 3 or the load lock chamber 9. The load lock chamber 9 is the one which communicates the vacuum chamber with the open atmosphere. In order to evacuate into vacuum condition or to return the pressure to the atmospheric pressure, the load lock chamber 9 has space which is as small as possible such that the pressure condition can be quickly changed.

With the thus constituted apparatus, the etching treatment and the resist removal treatment are carried out in the same manner as in the afore-mentioned first embodiment. That is, the etching treatment is effected with the plasma of the halogen-type gas in the etching chamber and, then, the resist is removed in the post-etch treatment chamber using the plasma of, for example, an oxygen gas which is one of the methods mentioned in the foregoing first embodiment. After the resist removal treatment, the sample 16 is introduced into the load lock chamber 9 shown in FIG. 10, and the halogen components that are causes of corrosion are removed as described below.

First, like in the treatment in the aforementioned second embodiment, the gas for adsorption/desorption treatment such as vaporized gas of pure water is supplied at a controlled flow rate into the load lock chamber 9 from the source (not shown) of feeding gas for adsorption/desorption treatment via the flow rate control valve 37 and the feed pipe 36. At this moment, the pressure control valve 40 for controlling the pressure in the load lock chamber 9 is maintained closed. This causes the pressure in the load lock chamber 9 to rise. Next, when the present pressure is reached in the load lock chamber, i.e., when a pressure region indicated by A in FIG. 8 (pressure higher than the one capable of condensing the introduced gas) is reached that is above the saturated vapor pressure curve, the supply of gas is discontinued, the pressure control valve 40 is opened, and the interior of the load lock chamber 9 is evacuated (the pressure in the load lock chamber 9 is reduced to be shifted to the region indicated by B in FIG. 9). For instance, the operation is repeated twice in which the sample plate temperature is maintained at about 20° C., the pressure in the post-etch treatment chamber 8 is raised from 67 Pa to 4000 Pa and is decreased again to 67 Pa each time, in the same manner as in the processing of the aforementioned second embodiment. Next, the sample 16 is heated by the heating device 34 (lamp heater).

By effecting the above-mentioned operation, the halogen components that are causes of corrosion are dissolved and eluted on the surface of the sample after the resist removal treatment owing to the adsorption of the introduced gas and the liquefaction by the rise in the gas pressure. Thereafter, the interior of the load lock chamber 9 is evacuated to promote the vaporization and desorption of pure water in which are dissolved and diluted halogen components remaining on the sample surface. This makes it possible to greatly decrease the amount of halogen components adhered to and remaining on the sample. By heating the sample 16 by the heating device 34, furthermore, the water content remaining after the adsorption/desorption operation is removed by evaporation. Therefore, the effect by the halogen component-containing water decreases, and high corrosion protection performance is obtained.

This embodiment makes it possible to obtain high corrosion prevention performance as described above. Furthermore, since the load lock chamber 9 having small inner space is used as the treatment chamber, the vaporized gas of pure water needs be supplied in small amounts compared with the desorption treatment of residual halogen components by dissolution and delution in the post-etch treatment chamber 8. Furthermore, a good response in the pressure change enables the throughput to be improved. Further, since the sample 16 is directly heated by the heating devicd 34, the time of desorption treatment can be shortened compared with the time of desorption treatment by the heating with oxygen plasma in the post-etch treatment chamber 8 mentioned in the foregoing third embodiment. This makes it possible to increase the amount of treating the smaples per a unit time in carrying out the treatment continuously and consistently.

In this embodiment, the halogen components are dissolved and diluted using the vaporized gas of pure water in the load lock chamber 9, and the pure water in which the halogen components are dissolved and diluted is subjected to the vaporization/desorption treatment, and the water remaining after the adsorption/desorption operation by the heating device 34 is removed by vaporization. It is, however, also allowable to dissolve and dilute the halogen components using the vaporized gas of pure water in the post-etch treatment chamber 8 followed by the evaporation/desorption treatment of pure water in which the halogen components are dissolved and diluted, and to remove by vaporization the water that remains after the adsorption/desorption operation using the heating device 34 in the load lock chamber 9. In this case, the load lock chamber 9 should be provided with the heating device 34 only.

According to the present invention as described above, the components that are causes of corrosion after the etching treatment of the wiring film are effectively decreased, and high corrosion prevention performance is imparted to the wiring film.

Moreover, the apparatus is constituted in a compact size contributing to improving the productivity.

Further, the features of the apparatus of the present invention are as follows:

1. A sample treatment apparatus for treating aluminum-containing wiring materials, comprising an etching chamber, a post-etch treatment chamber, means for introducing a sample into the etching chamber, means for carrying the sample from said etching chamber into said post-etch treatment chamber, means for delivering the sample from said post-etch treatment chamber, means for feeding a gas for adsorption/desorption into said post-etch treatment chamber, and an exhaust device for evacuating the interior of said post-etch treatment chamber.

2. A sample treatment apparatus for treating aluminum-containing materials comprising means for etching the sample, means for removing resist from the sample after the etching, means for evacuating the chamber in which the sample is placed after the resist has been removed, means for starting and stopping the evacuation of said chamber, and means for feeding a gas for adsorption/desorption into the chamber in which said sample is placed.

3. A sample treatment apparatus as set forth in 2 above, wherein the chamber in which the sample is placed is the one in which the resist is removed.

4. A sample treatment apparatus as set forth in 2 above, wherein the chamber in which the sample is placed is the one which is different from the chamber in which the resist is removed but is the one of before the sample is being delivered into the open air.

5. A sample treatment apparatus as set forth in 4 above, wherein the chamber of before the sample is delivered into the open air is the load lock chamber.

6. A sample treatment apparatus as set forth in 2 above, wherein said chamber is provided with means for heating said sample.

7. A sample treatment apparatus as set forth in 2 above, wherein said chamber is provided with means for cooling said sample.

8. A sample treatment apparatus as set forth in 4 above, wherein said chamber is provided with means for heating said sample.

What is claimed is:

1. A sample made by a method, comprising:

a step for providing a substrate, and, provided thereover, a wiring metal including an aluminum-containing layer and another layer composed of Ti, N, or W components, and a resist;

a step for etching said wiring metal of said sample by using a plasma including a halogen component to produce a residual having said halogen component on at least a part of a surface of said sample; and a step for removing said resist and said residual by using a plasma including an oxygen component and a hydrogen component but excluding a halogen component.

2. A sample made by a method, comprising;

providing a substrate, an aluminum-containing wiring material on a surface thereof and a patterned resist over said aluminum-containing wiring material;

etching said aluminum-containing wiring material with a halogen containing gas using said patterned resist as a mask, thereby forming a wiring pattern;

removing said resist using a gas containing an oxygen component; and then feeding a hydrogen component containing gas to a treatment chamber in which said sample is provided, thereby increasing a pressure within said chamber until said hydrogen component containing gas is condensed and adsorbed on said sample;

allowing halogen components from at least said wiring pattern to dissolve in the condensed and adsorbed hydrogen component containing gas; and then decreasing the pressure within said chamber to vaporize the condensed and adsorbed hydrogen containing gas to remove halogen components from at least said wiring pattern, thereby imparting a high corrosion prevention performance to said wiring pattern.

3. A sample made by a method, comprising:

providing a substrate, a barrier metal film over a surface thereof, an aluminum-containing wiring material over said barrier metal film and a patterned resist over said aluminum-containing wiring material;

etching said aluminum-containing wiring material with a halogen containing gas using said patterned resist as a mask, thereby forming a wiring pattern; and simultaneously removing said resist and removing halogen components from at least said wiring pattern by exposing said sample to a plasma of methanol and oxygen, thereby imparting a high corrosion prevention performance to said wiring pattern.

4. A sample having an aluminum-containing wiring material, the sample being treated by a method comprising:

a step for etching the sample having aluminum-containing wiring material using a halogen gas; and a step for effecting a corrosion prevention treatment which removes a halogen component on at least a surface of said sample using a plasma that has at least a hydrogen component and an oxygen component but excluding a halogen component, said hydrogen component being selected from the group consisting of hydrogen, a hydrocarbon and a compound consisting of carbon, hydrogen and oxygen.

5. A sample having aluminum-containing wiring material, the sample being treated by a method comprising:

a step for etching the sample having aluminum-containing wiring material using a halogen gas to produce a residual on at least a part of a surface of the sample; and a step for effecting a treatment which removes said residual from at least a surface of said sample using a plasma that has at least a hydrogen component and an oxygen component but excluding a halogen component, said hydrogen component being selected from the group consisting of hydrogen, a hydrocarbon and a compound consisting of carbon, hydrogen and oxygen.

6. A sample having a wiring material including an aluminum-containing layer and another layer composed of Ti, N, or W components, the sample being treated by a method comprising:

a step for etching the sample having said wiring material coated with a resist using a halogen gas thereby forming residual adhered matter having a halogen component; and a step for simultaneously removing a resist and said residual adhered matter having said halogen component from at least a surface of said samples using a gas that has an oxygen component and a hydrogen component but excluding a halogen component, said hydrogen component being selected from the group consisting of hydrogen, a hydrocarbon and a compound consisting of carbon, hydrogen and oxygen.

7. A sample made by a method, comprising:

providing a substrate, an aluminum-containing wiring material over said substrate and a patterned resist over said aluminum-containing wiring material;

etching said aluminum-containing wiring material with a halogen containing gas using said patterned resist as a mask, thereby forming a wiring pattern and forming residual adhered matter containing a halogen component on at least a part of a surface of said sample; and simultaneously removing said resist and said residual adhered matter from at least said wiring pattern by exposing said sample to a plasma of a gas having at least a hydrogen component and an oxygen component but excluding a halogen component.

8. A sample according to claim 7, wherein said sample further comprises a barrier metal film provided over a surface of said substrate and wherein said aluminum-containing wiring material is provided over said barrier metal film.

9. A sample according to claim 7, wherein said barrier metal film is made of a material selected from the group consisting of TiN and TiW.

10. A sample according to claim 7, wherein said hydrogen component is selected from the group consisting of hydrogen, a hydrocarbon and a compound consisting of carbon, hydrogen and oxygen and wherein said oxygen component is selected from the group consisting of oxygen, ozone, and nitrous oxide.

11. A sample according to claim 7, wherein said plasma is a plasma of methanol and oxygen.

12. A sample according to claim 7, wherein the step of simultaneously removing said resist and removing said residual adhered matter is conducted at a temperature of 200° C. to 350° C.

* * * * *